March 5, 1974 W. H. TARN 3,795,554
PROCESS FOR SIMULTANEOUS DIFFUSION OF GROUP III-GROUP V INTERMETALLIC COMPOUNDS INTO SEMICONDUCTOR WAFERS
Filed Dec. 20, 1972 2 Sheets-Sheet 1

March 5, 1974 W. H. TARN 3,795,554

PROCESS FOR SIMULTANEOUS DIFFUSION OF GROUP III-GROUP V INTERMETALLIC COMPOUNDS INTO SEMICONDUCTOR WAFERS

Filed Dec. 20, 1972 2 Sheets-Sheet 2

United States Patent Office 3,795,554

Patented Mar. 5, 1974

3,795,554

PROCESS FOR SIMULTANEOUS DIFFUSION OF GROUP III–GROUP V INTERMETALLIC COMPOUNDS INTO SEMICONDUCTOR WAFERS

William H. Tarn, Culver City, Calif., assignor to International Rectifier Corporation, Los Angeles, Calif.

Filed Dec. 20, 1972, Ser. No. 316,870
Int. Cl. H01l 7/44
U.S. Cl. 148—189 11 Claims

ABSTRACT OF THE DISCLOSURE

A monocrystalline silicon wafer is covered with a silicon dioxide coating, and windows are selectively formed in the silicon dioxide coating. The wafer is then loaded into a diffusion chamber which contains a gallium arsenide compound in pure stoichiometric form as well as a mass of pure gallium. The temperature of the diffusion vessel is then raised to cause diffusion into the water to form a plurality of junctions of given shape therein with a single diffusion step.

BACKGROUND OF THE INVENTION

This invention relates to a novel process for forming a plurality of junctions in a semiconductor wafer, and more specifically relates to a novel process in which a Group III–V intermetallic compound and a pure Group III metal are each used as a diffusion source for diffusion of junctions into a partly masked silicon wafer.

Semiconductor devices which contain a plurality of junctions, such as transistors, thyristors and triacs, are well known. In forming the several junctions in such devices, it is common practice to have several different diffusion cycles or a combination of several diffusion cycles and alloying cycles, thereby subjecting the device to extremely elevated diffusion temperatures on two or more occasions. It is preferable that the device be subjected to the very high temperatures required for diffusion of impurity elements only a single time since the completed device will have improved and reproducible characteristics. Gallium arsenide, per se, as a diffusion source is known and has been described, for example, in U.S. Pat. 3,579,815. The use of gallium arsenide alone as a diffusion source, however, creates serious control problems in controlling the relative proportions of gallium and arsenic which are being diffused and, therefore, the parameters of the device which is being formed.

BRIEF SUMMARY OF THE INVENTION

In accordance with the present invention, a Group III–V intermetallic compound, such as gallium arsenide, as well as a pure Group III metal such as gallium or a pure Group V metal is used as the source of impurity atoms for a single diffusion cycle.

In carrying out the invention, a silicon wafer is prepared with a silicon dioxide mask thereon which, in turn, has one or more windows therein which are to be exposed to the vapor products from the gallium arsenide and gallium sources at an elevated diffusion temperature, whereby the P-type gallium impurity will diffuse easily through the silicon dioxide layer, whereas the N-type arsenic atoms will be blocked by the silicon dioxide layer, and will tend to diffuse only into the silicon surfaces exposed by the windows in the silicon dioxide coating. Thus, P-type regions will be formed immediately beneath the silicon dioxide coating, whereas N-type regions will be formed adjacent the windows in the silicon dioxide coating, assuming that the substrate is initially of the N type.

In accordance with one embodiment of the present invention, and in order to assist in the control of vapor pressures, a mass of pure gallium metal is placed in a sealed diffusion chamber along with a gallium arsenide compound in stoichiometric form. The Group III pure metal (gallium in the particular example herein) acts as an additional source of gallium impurity atoms to control the ratio of Group III to Group V atoms in the diffusion atmosphere, and further acts as a sump to arsenic atoms by tending to dissolve and take into solution excess arsenic atoms from the gallium arsenide.

The present invention contemplates the use of any desired Group III–V intermetallic compound which is used in connection with a pure mass of metal from Group III or Group V. Thus, the Group III–V compound can be gallium phosphide, which could be used as a diffusion source along with pure gallium metal. Alternatively, the Group III–V intermetallic compound could be aluminum antimonide, wherein the pure metal mass would be of aluminum.

Preferably, the process is carried out by loading measured amounts of the group III–V intermetallic compound and a measured amount of the pure Group III metal into a sealed diffusion chamber so that the process is self-limiting. However, it will be apparent that the process could also be carried out in an open tube diffusion-type system.

DETAILED DESCRIPTION OF THE DRAWINGS

Figure 1:
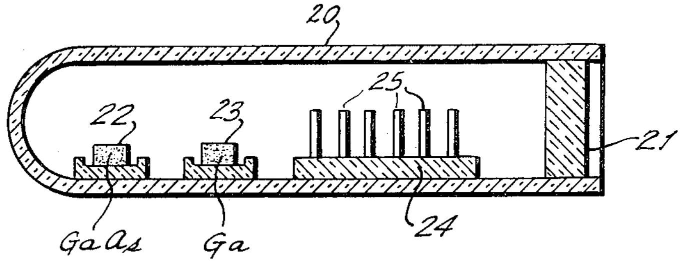
FIG. 1 schematically illustrates in cross-section a sealed diffusion vessel containing a Group III–V intermetallic compound; a Group III pure metal; and a boat of semiconductor wafers which are to be diffused.

Referring now to the drawings, FIG. 1 illustrates in cross-sectional view, and in a schematic fashion, a sealed diffusion vessel 20 which is sealed with a quartz plug 21 and has loaded therein a Group III–V intermetallic compound source 22, and a corresponding pure metal source 23. The pure metal source 23 will usually be of the same metal as the Group III metal in the intermetallic compound 22. A conventional boat 24, carrying a plurality of spaced silicon wafers 25, is then loaded within the chamber 20. Wafers 25 conventionally will be monocrystalline silicon wafers which have been prepared, as will be described hereinafter in connection with FIGS. 2 to 5, before they are loaded into the chamber 20.

The Group III–V intermetallic compound 22 is preferably gallium arsenide in the pure stoichiometric form and the metal 23 is preferably gallium. Alternatively, the Group III–V metal 22 can be gallium phosphide or gallium antimonide. In these cases, pure gallium metal would also be used for the metal 23. As a further example, aluminum antimonide can be used for the Group III–V metal where Group III aluminum would be used for the metal 23.

Figure 3:
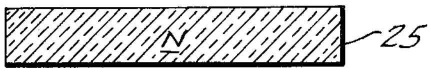
FIG. 3 is a cross-sectional view of FIG. 2 taken across the section line 3—3 in FIG. 2.
Figure 2:
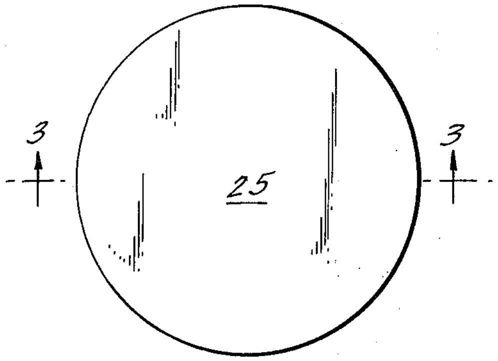
FIG. 2 is a top view of a typical wafer which could be loaded into the diffusion chamber of FIG. 1.
Figure 4:
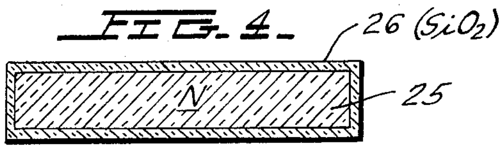
FIG. 4 shows the wafer of FIG. 3 after the formation of a silicon dioxide coating therein.

In preparing the wafers 25 for diffusion, an N-type wafer is prepared as shown in FIGS. 2 and 3 which, conventionally, can have a diameter of about 1.300 inches and a thickness of from 8.0 to 9.0 mils. The wafer may have a resistivity of about 100 ohm centimeters.

The first step in the process is to form a silicon dioxide coating 26 on the wafer 25 through any of the conventional processes. For example, the wafer can be heated to a furnace temperature of about 1200° C. in an ambient atmosphere of oxygen gas and steam for a given length of time. In the particular example set forth to produce a particular thyristor, the silicon dioxide coating will be 0.01 to 0.20 mil thick.

Figure 5:
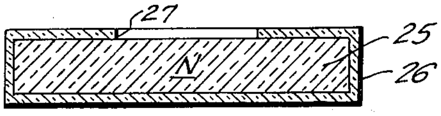
FIG. 5 shows the wafer of FIG. 4 after a single window is formed in the wafer preparatory to the manufacture of a thyristor device.

In order to produce a thyristor device, and as shown in FIG. 5, a circular window 27 is formed in the silicon dioxide coating 26 by conventional photoresist and etching techniques to expose the bare surface of the wafer 25 through the window 27. Wafers of the form shown in FIG. 5 are then cleaned and loaded into the boat 24 of FIG. 1, and are placed in the diffusion chamber 20.

The chamber 20 is suitably and conventionally prepared and is back filled with a suitable inert gas such as argon, for example, at 270 millimeters absolute pressure. The purpose of the gas is to keep the tube 20 from collapsing under the extremely high diffusion temperatures, and further serves to maintain a clean and inert atmosphere for the diffusion process. At the same time, a Group III–V intermetallic compound 22, preferably gallium arsenide and a pure mass of metallic gallium, is loaded into the diffusion vessel 20. By way of example, where 200 wafers are to be simultaneously diffused, good results have been obtained using 1.4 grams of gallium arsenide and 0.6 gram of gallium.

As pointed out previously, other Group III–V intermetallic compounds and other pure metals could be loaded into the tube in place of gallium arsenide and pure gallium.

Thereafter, the temperature within vessel 20 is raised, with a typical diffusion process lasting about 40 hours at 1237° C. Diffusion will then proceed from the gallium and arsenic atmosphere surrounding the wafers 25 such that the P-type gallium impurity atoms will diffuse faster than the N-type arsenic impurity atoms and, moreover, such that the P-type gallium will penetrate the silicon dioxide mask 26 easily, whereas the N-type arsenic will not penetrate mask 26.

In choosing the particular intermetallic compound to be used, it is, therefore, necessary that the two impurity atoms will have unique diffusion coefficients at the diffusion temperature. Moreover, the two different impurities should have unique solubility limits and diffusion velocities in the silicon dioxide layer used as a diffusion mask. Thus, by selecting different silicon dioxide thicknesses, it is possible to delay or exclude the arrival of certain impurity atoms at the silicon surface.

Figure 6:
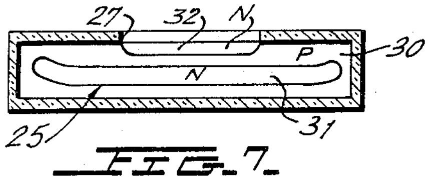
FIG. 6 illustrates the formation of junctions in the wafer of FIG. 5 after diffusion in the chamber of FIG. 1.

FIG. 6 illustrates the diffusion pattern and junctions which are formed in the wafer of FIG. 5, where it is seen that a P-type shell 30 is formed which surrounds the N-type core 31 within the wafer. An N-type region 32 is formed beneath window 27. The P-type shell 30 is formed by gallium impurity atoms which penetrated the silicon dioxide layer 26 to the depth of the N-type core region 31. The outer surface of the P-type region will have a sheet resistance at its surface of about 10 ohms per square in the example herein. The N-type region 32, formed within the window 27, is formed since the arsenic atoms are able to reach the silicon surface exposed by window 27. The region is N-type since the P-type gallium atoms diffuse much more rapidly than the N-type arsenic atoms and because the arsenic concentration is much greater than the gallium concentration at the surface. Thus, the region 32 remains N-type, with its surface having a sheet resistance of about 0.4 ohm per square at the end of the diffusion cycle.

It will be noted that the simultaneous diffusion of the Group III–V intermetallic compound, when modified in concentration by a pure metal such as a Group III metal, permits a wide latitude in selection of desired junction depths, distribution of impurity regions and impurity gradient distributions by control of the following variables:

(1) the weight of the intermetallic source 22;
(2) the weight of the gallium sump source 23;
(3) diffusion temperature;
(4) time at diffusion temperature;
(5) location and temperature of the impurities in the sealed diffusion tube.

Good results were obtained with the ratio of gallium arsenide to pure gallium in the sealed tube of FIG. 1 being approximately 2 to 1 by weight. In the process described above, the N-type region 32 will have a depth of about 1 mil while the P-type shell 30 has a depth of about 2.2 mils around the entire surface of the device.

Figure 7:
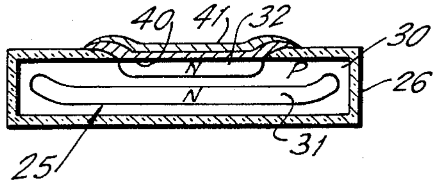
FIG. 7 illustrates the wafer of FIG. 6 after the formation of conductive layers on what is to become the cathode surface.

In order to complete the wafer for use as a thyristor, the diffused wafers of FIG. 6 are next removed from the diffusion chamber and are suitably cleaned. Thereafter, and as shown in FIG. 7, the wafers are plated, first with a nickel layer 40 and then with a gold layer 41 over the exposed window region 27. More specifically, in cleaning the wafer of FIG. 6, the wafer is suitably etched so that the window 27 is slightly undercut to expose the region at which the boundary of the N-type material 32 intersects the upper surface of the wafer.

A lower nickel layer 40 is then applied by a conventional electrodeless plating process, where the nickel adheres only to the exposed silicon surface, but not to the silicon dioxide coating 26. The nickel layer 40 is then followed by a gold plating layer 41 which adheres only to the nickel layer 40. Note that nickel layer 40 and gold plating layer 41 extend slightly across the edge of the junction defined between N-type region 32 and P-type region 30 to serve as a shorted emitter connection in the completed device.

The wafer of FIG. 7 is then exposed to a sandblast in which the periphery of the wafer is sandblasted to the conical shape 50, where the sandblasting operation serves to sever the edges of N-type region 31, thereby to define two isolated junctions 51 and 52 for the device. These operate in connection with the further junction 53 to form a conventional controlled rectifier configuration.

Figure 9:
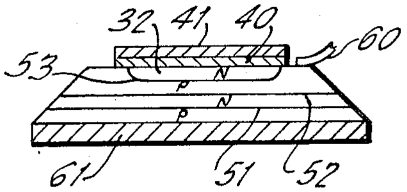
FIG. 9 shows the wafer of FIG. 8 after the addition of gate and anode electrodes, with the device now ready for insertion into a suitable package.

The device is then completed as shown in FIG. 9 by the addition of an aluminum gate lead 60 and a molybdenum or tungsten anode electrode 61 of conventional type. The completed device is then ready for insertion into a suitable package.

Thyristors made in the manner described above have been found to have superior turn-off characteristics than devices which have been formed by prior known techniques. More specifically, the turn-off times of thyristors made according to the above-noted process are substantially shorter than the turn-off times of devices made by other processes and typically are as low as 10 microseconds maximum turn-off time. Typically, the devices will turn off in 6 microseconds. Thus, the devices have important applications in inverter circuits or other applications requiring extremely fast turn-off. Note however, that devices made using the novel invention have broad application since the devices formed require only a single diffusion cycle to decrease manufacturing costs and handling.

Figure 10:
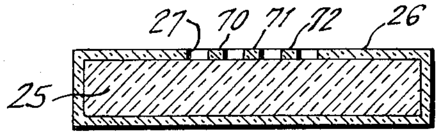
FIG. 10 illustrates a second embodiment of the invention wherein the silicon dioxide coating shown in FIG. 5 is provided with additional small dioxide sections over what is to become a cathode region of the wafer.
Figure 11:
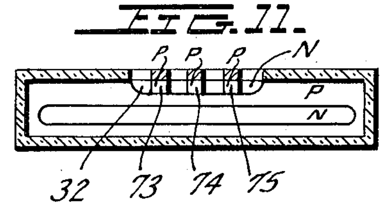
FIG. 11 illustrates the wafer of FIG. 10 after diffusion in the chamber of FIG. 1 and illustrates the formation of P-type "pylons" which are useful for cathode emitter-shorting functions.
Figure 8:
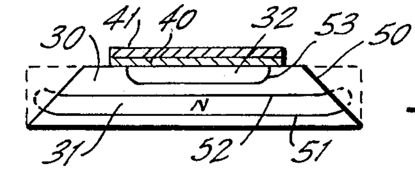
FIG. 8 shows the wafer of FIG. 7 after tapering the wafer periphery to define isolated junctions.

FIGS. 10 and 11 show one modification of the invention wherein the thyristor device formed is provided with P-type pylons extending through the N-type region 32 of the device of FIGS. 6 to 9 in order to create an extremely effective shorted emitter configuration. This is obtained as shown in FIGS. 10 and 11 by forming the silicon dioxide coating 26 of FIG. 5 to have additional dots, typically shown as dots 70, 71 and 72, over the exposed surface of wafer 25 within window 27. Thus, during the diffusion process in the chamber of FIG. 1, the diffusion of N-type impurities beneath silicon dioxide dots 70, 71 and 72 will be impeded. Therefore, the region beneath these dots after diffusion will be of the P-type, due to the gallium penetration of the oxide, shown as P-type pylons 73, 74 and 75 in the completed device which extend through N-type region 32. Thus, in the completed device of FIG. 9, the P-type pylons 73, 74 and 75 will cause the effect of a shorted emitter configuration.

Figure 12:
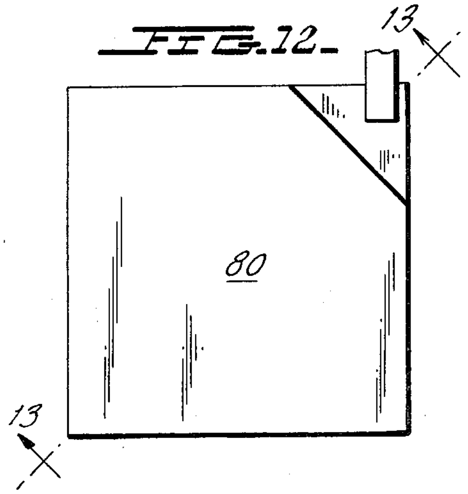
FIG. 12 is a top plan view of another form of a completed thyristor device which could be made in accordance with the present invention.

While the arrangements shown in FIGS. 2 to 11 above have shown the application of the invention to a circular wafer, it will be apparent that the invention can also be applied to other shape wafers and, moreover, can be used to form a plurality of small devices in a single large wafer where the devices are scribed away from one another after the diffusion operation. One such completed device is shown in FIG. 12 as the generally square tyristor wafer 80, having a bottom anode electrode 81, an upper cathode electrode 82, and a gate electrode 83.

Figure 13A:
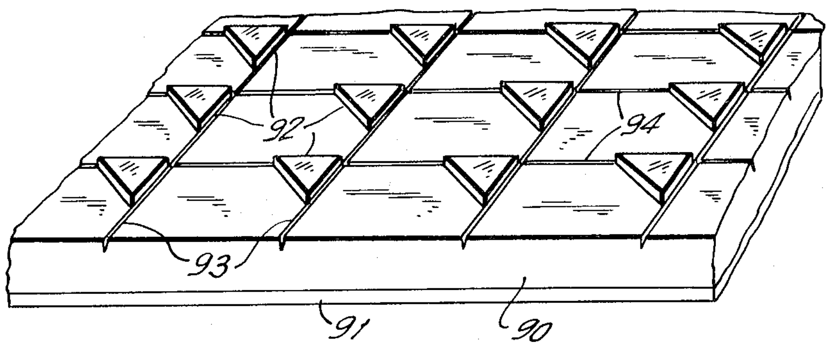
FIG. 13*a* shows a wafer prepared from silicon dioxide sections for the formation of a plurality of devices such as the one shown in FIGS. 12 and 13.
Figure 13:
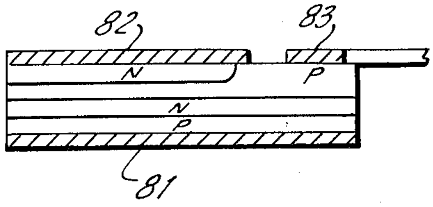
FIG. 13 is a cross-sectional view of FIG. 12 taken across the section line 13—13 in FIG. 12.

The pattern of N and P regions shown in FIG. 13 can obviously be formed by a suitable silicon dioxide masking pattern such as that shown in FIG. 13*a*. Thus, in FIG. 13*a*, the overall wafer 90 is initially coated with silicon dioxide. This oxide coating is then selectively removed so that wafer 90 has a continuous bottom oxide layer 91 and is provided with spaced triangular oxide layers 92 on the upper surface. Thus, the upper surface of wafer 90 has a bare silicon surface exposed except for triangular sections 92.

When the wafer of FIG. 13*a* is then diffused in the tube of FIG. 1, a plurality of devices having the junction pattern shown in FIG. 13 are produced. These individual devices are then separated from one another as by scribing and etching along lines 93 and 94, by way of example, so that a plurality of individual devices are formed from one wafer. The individual devices are then appropriately cleaned and provided with electrodes and are then varnished for subsequent assembly in a circuit or in an individual housing.

Figure 15:
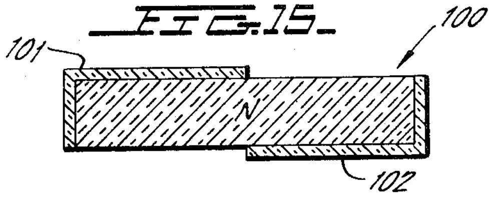
FIG. 15 is a cross-sectional view of FIG. 14 taken across the section line 15—15 in FIG. 14.
Figure 14:
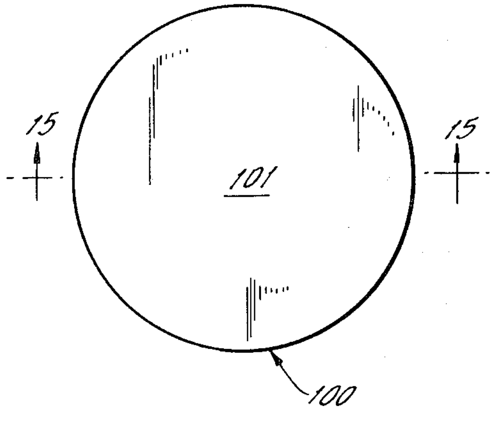
FIG. 14 is a top view of a wafer which has been prepared with silicon dioxide coatings such that the ultimate device to be formed will be a triac-type device.
Figure 16:
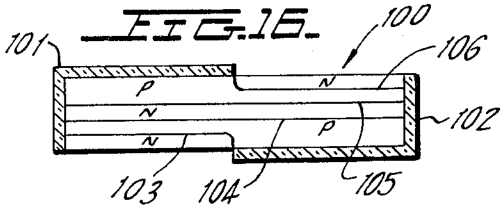
FIG. 16 shows the junction pattern formed in the wafer of FIG. 15 after diffusion in the chamber of FIG. 1.

Junction patterns other than those shown in FIGS. 9, 11 and 13 could be provided with the invention. Thus, a triac device can be formed, as shown in FIGS. 14 to 17. FIGS. 14 and 15 show the initial wafer 100 which may be of the N type. The wafer 100 is provided with two silicon dioxide coatings 101 and 102 which each cover diametrically opposite surface portions on the top and bottom of the wafer. The wafer is then loaded into the diffusion apparatus of FIG. 1, and diffusion takes place to form the junction pattern shown in FIG. 16 consisting of junctions 103, 104, 105 and 106.

The N-type material disposed between junctions 104 and 105 is the original core of N-type material of the initial wafer. The P regions above and below junctions 105 and 104, respectively, are formed beneath silicon dioxide regions 101 and 102 by the diffusion of gallium atoms through the silicon dioxide layers and by the blocking of the N-type arsenic atoms by the silicon dioxide. The formation of the P-type regions below and above junctions 106 and 103, respectively, is produced because of the relatively fast and deep diffusion characteristics of the P-type gallium as compared to the slower diffusion characteristics of the arsenic atoms. The outer N regions above and below junctions 106 and 103 are produced due to the predominance of arsenic atoms which enter these umasked surfaces and because of the more rapid diffusion and deeper diffusion of the P-type gallium atoms.

Figure 17:
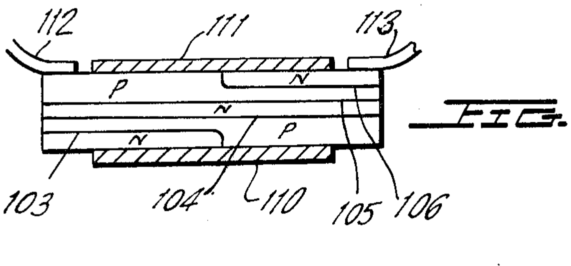
FIG. 17 shows the wafer of FIG. 16 after the triac wafer has been completed and is ready for insertion into the package.

The completed device is then formed as shown in FIG. 17, such that, after cleaning of the wafer, main electrodes 110 anl 111 are added to the upper and lower wafer surfaces and gates 112 and 113 are added to the P-type region and N-type region, respectively. The device is then placed in an appropriate package as desired.

While the description of the invention is described above as being carried out in the closed diffusion tube 20, it will be apparent to those skilled in the art that the same process can also be carried out by open tube diffusion, with appropriate controls of temperature, amounts of Group III–V intermetallics being used, and appropriate control of the mass of pure metal being used. Moreover, various combinations of intermetallic compounds along with a pure metal of the intermetallic can also be used as well as the gallium arsenide-gallium system described in connection with the preferred embodiment of the invention.

Although there has been described a preferred embodiment of this novel invention, many variations and modifications will now be apparent to those skilled in the art. Therefore, this invention is to be limited, not by the specific disclosure herein, but only by the appended claims.

I claim:

1. The process of forming a plurality of spaced P-N junctions in a monocrystalline silicon wafer; said process comprising the steps of:

forming a diffusion mask on the outer surface of said silicon wafer, forming at least one window in said diffusion mask, loading said wafer into a diffusion chamber and loading a measured mass of a Group III–V intermetallic compound and a measured mass of a pure metal selected from the group consisting of Group III and Group V metals into said diffusion chamber, heating said diffusion chamber to a diffusion temperature and forming, in a single diffusion cycle, a P-type region in said wafer beneath said diffusion mask and an N-type region in regions of said wafer exposed by said mask.

2. The process of claim 1 wherein said window is formed adjacent one surface of said wafer.

3. The process of claim 1 wherein said Group III–V intermetallic compound is in pure stoichiometric form.

4. The process of claim 1 wherein said Group III–V intermetallic compound is gallium arsenide and wherein said Group III metal is pure gallium.

5. The process of claim 1 wherein said diffusion chamber is sealed and is filled with an inert gas.

6. The process of claim 1 wherein said silicon wafer is of the N-type conductivity before diffusion.

7. The process of claim 1 wherein a plurality of spaced windows are formed in said diffusion mask, thereby to define a plurality of spaced P-type regions in the completed device.

8. The process of claim 1 wherein said diffusion mask consists of a layer of silicon dioxide.

9. The process of claim 8 wherein said Group III–V intermetallic compound is gallium arsenide and wherein said Group III metal is pure gallium.

10. The process of claim 9 wherein said diffusion chamber is sealed and is filled with an inert gas.

11. The process of forming a plurality of spaced P-N junctions in a monocrystalline silicon wafer; said process comprising the steps of:

forming a diffusion mask on only a portion of the surface of said wafer, loading said wafer into a diffusion chamber and loading a measured mass of a Group III–V intermetallic compound and a measured mass of a pure metal selected from the group consisting of Group III and Group V metals into said diffusion chamber, heating said diffusion chamber to a diffusion temperature and forming, in a single diffusion cycle, a P-type region in said wafer beneath said diffusion mask and an N-type region in regions of said wafer exposed by said mask.

References Cited

UNITED STATES PATENTS

| | | | |
|---|---|---|---|
| 2,793,145 | 5/1957 | Clarke | 148—190 |
| 2,802,760 | 8/1957 | Derick et al. | 148—189 |
| 3,341,381 | 9/1967 | Bergman et al. | 148—190 X |
| 3,442,722 | 5/1969 | Bauerlein et al. | 148—178 |
| 3,468,017 | 9/1969 | Stacey et al. | 148—189 X |
| 3,615,945 | 10/1971 | Yokozawa | 148—189 X |
| 3,664,896 | 5/1972 | Duncan | 148—187 |
| 3,748,198 | 7/1973 | Basi et al. | 148—190 X |

GEORGE T. OZAKI, Primary Examiner

U.S. Cl. X.R.

148—187, 190; 252—62.3 E; 317—235 R